(12) United States Patent
Cohen et al.

(10) Patent No.: US 12,092,680 B2
(45) Date of Patent: Sep. 17, 2024

(54) METHOD FOR DETECTING A RANDOM STATE TRANSITION IN A CONDUCTING LINE, PARTICULARLY A SUPERCONDUCTING LINE

(71) Applicant: COMMISSARIAT A L'ENERGIE ATOMIQUE ET AUX ENERGIES ALTERNATIVES, Paris (FR)

(72) Inventors: Josy Cohen, Gif-sur-Yvette (FR); Louise Revault, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/431,193

(22) Filed: Feb. 2, 2024

(65) Prior Publication Data

US 2024/0264215 A1 Aug. 8, 2024

(30) Foreign Application Priority Data

Feb. 3, 2023 (FR) ...................................... 2301023

(51) Int. Cl.
 *G01R 31/11* (2006.01)
 *G01R 31/08* (2020.01)
(52) U.S. Cl.
 CPC ............ *G01R 31/11* (2013.01); *G01R 31/083* (2013.01)
(58) Field of Classification Search
 CPC ............................. G01R 31/11; G01R 31/083
 (Continued)

(56) References Cited

U.S. PATENT DOCUMENTS 7,312,613 B1 * 12/2007 Chen ...................... G01R 31/11
 324/543
8,390,302 B2 * 3/2013 Mousavi .............. H02H 3/0935
 324/539

(Continued)

FOREIGN PATENT DOCUMENTS

EP 0 415 709 A2 3/1991

OTHER PUBLICATIONS

Beziuk, et al., "Locating Electrical Faults in Superconducting Accelerator Magnets Using Time Domain Reflectometry", IEEE Transactions on Applied Superconductivity, vol. 28, No. 3, pp. 1-5, 2018.

(Continued)

*Primary Examiner* — Christopher P McAndrew
(74) *Attorney, Agent, or Firm* — BakerHostetler

(57) ABSTRACT

A method for detecting a random transition in a conducting line, includes the steps of: making a first reference reflectometry measurement on the conducting line in order to deduce a reference time-domain reflectogram therefrom, identifying at least one characteristic of the reference time-domain reflectogram, making a second reflectometry measurement on the conducting line to obtain a second time-domain reflectogram, identifying the same at least one characteristic in the second time-domain reflectogram, and for each amplitude peak identified, determining a difference between the at least one characteristic measured on the reference time-domain reflectogram and the same characteristic measured on the second time-domain reflectogram, evaluating, from a plurality of successive measurements, whether the difference increases in absolute value, and, if this is the case, triggering a warning corresponding to the appearance of a random transition.

12 Claims, 10 Drawing Sheets

(58) Field of Classification Search
USPC .......................................................... 324/533
See application file for complete search history.

(56) References Cited

U.S. PATENT DOCUMENTS

| | | | | |
|---|---|---|---|---|
| 2006/0181283 | A1* | 8/2006 | Wajcer | .................... H04B 3/46 |
| | | | | 324/539 |
| 2018/0143239 | A1* | 5/2018 | Sallem | .................... H04B 3/46 |
| 2018/0328975 | A1 | 11/2018 | Sallem et al. | |
| 2021/0072302 | A1* | 3/2021 | Frohne | ................. G01R 31/083 |
| 2021/0278452 | A1 | 9/2021 | Kafal et al. | |
| 2022/0170978 | A1 | 6/2022 | Shin et al. | |

OTHER PUBLICATIONS

Bang, et al., "Abnormality Monitoring for Three-Phase HTS Cable via Time-Frequency Domain Reflectometry", IEEE Transactions on Applied Superconductivity, vol. 31, No. 5, 2021.

French Preliminary Search Report issued in French Patent Application No. 2301023 issued on Aug. 24, 2023, with English translation.

Lee, et al., "Insulation characteristics and fault analysis of HTS cable via stepped frequency waveform reflectometry", IEEE Transactions on Applied Superconductivity, vol. 29, No. 5, 2019.

Chen, et al., "Research on quench detection method using radio frequency wave technology", IEEE Transactions on Applied Superconductivity, vol. 30, No. 2, 2020.

Lee, et al., "Time-frequency-based insulation diagnostic technique of high-temperature superconducting cable systems", IEEE Transactions on Applied Superconductivity, vol. 26, No. 4, 2016.

Lee, et al., "Monitoring electrical and thermal characteristics of HTS cable systems via time-frequency domain reflectometry", IEEE Transactions on Applied Superconductivity, vol. 27, No. 4, 2017.

Bang, et al., "Detection of local temperature change on HTS cables via time-frequency domain reflectometry", Journal of Physics: Conference Series, 29th International Symposium on Superconductivity, 2017.

* cited by examiner

METHOD FOR DETECTING A RANDOM STATE TRANSITION IN A CONDUCTING LINE, PARTICULARLY A SUPERCONDUCTING LINE

CROSS-REFERENCE TO RELATED APPLICATION

This application claims priority to foreign French patent application No. FR 2301023, filed on Feb. 3, 2023, the disclosure of which is incorporated by reference in its entirety.

FIELD OF THE INVENTION

The invention concerns the field of methods of monitoring and diagnosing the state of health of a conducting line, particularly a line of superconducting material, such as a superconducting coil.

BACKGROUND

The invention relates to a method and a system for detecting the appearance of a random state transition, particularly a transition due to a change from a superconducting state to a resistive state in a superconducting line such as a coil. The invention also proposes to monitor the variation of such a transition and to supply information for locating the area of the line affected.

The invention is applicable to any system in which conducting or superconducting lines such as coils, windings or electrical cables are used.

With regard to superconducting materials, these are characterized by limit values, independent of current, temperature and magnetic field, that enable the superconducting properties to be preserved. If one of these limits is exceeded locally, a random local transition from the superconducting state to a resistive state is propagated in the material. This phenomenon is usually referred to by the term "quench". In the following description, the term "random state transition" will be used to denote the occurrence of a quench. The loss of the superconducting property of a material means that it becomes resistive and therefore undergoes a transition to a resistive state (the inverse of the superconducting state, where the material has zero resistance). This phenomenon increases the temperature of the material locally, and may cause irreversible damage or even the destruction of materials as a result of the very high current density. There are various causes of a random state transition, which may notably be due to a source external to the line, to a fault on the line, or to a weak point.

For these reasons, it is important to be able to detect these transitions before they are propagated in the line. As a general rule, these transitions are detected by voltage measurements, which are invasive and, in the case of high critical temperature superconducting materials, not sensitive enough and therefore not quick enough. This retards their industrial development, even though their performance is much better than that of low critical temperature superconducting materials.

The theory of superconducting materials and their behaviour is not yet fully developed. It is therefore important to be able to investigate these transitions and their propagation.

There is also a similar need to detect and monitor the development of faults in electrical cables made of conducting materials.

A primary object of the present invention is to propose a novel method for detecting, monitoring and locating random transitions in conducting lines, particularly those made of superconducting material, and particularly for lines arranged in the form of coils.

A secondary object of the invention is to propose a reflectometry method which allows for the high mismatch at the input of the system, particularly for coils.

Existing systems for detecting random transitions in superconducting materials are based on voltage measurements. For example, in applications relating to research in this area, notably nuclear applications, the system concerned is the primary detection system. The aim of such a detection system is to measure the resistive term of the voltage in the coil. The value of the voltage over time in the coil is given by the following formula:

$$U_i(t) = R_i I_i + L_i \frac{dI_i}{dt} + \sum_{k=1}^{k=N} M_{ik} \frac{dI_k}{dt}$$

$R_i I_i$ is the resistive voltage corresponding to what is to be measured to detect a random transition;

$L_i dI/dI_i$ is the inductive voltage due to the inductance of the coil;

$$\sum_{k=1}^{k=N} M_{ik} \frac{dI_k}{dt}$$

is the inductive voltage due to the mutual inductance of the coil with N other circuits.

In order to retain only the first term of the equation, that is to say the resistive voltage, the monitored voltage may be compensated by a similar voltage recorded on another component.

Monitoring a superconducting material by voltage measurement is effective for low critical temperature superconductor systems LTS (<20K).

For high critical temperature superconductor systems HTS (in the region of 70K), the transition propagation velocity is slower. For such HTS systems, voltage measurement methods detect random transitions too late to provide effective protection of the system.

Other methods for detecting random transitions without voltage measurement have been proposed, including:

magnetic techniques based on measurements of changes in the magnetic field, for example using quench antennas or Hall sensor networks, optical techniques based on measurements of deformation or temperature change, using, for example, Bragg grating sensors, Rayleigh diffusion techniques, or Brillouin, Raman or special-purpose fibre techniques, passive acoustic techniques by measurement of acoustic emissions, active acoustic techniques by ultrasonic wave diffusion to measure transfer function changes, capacitive techniques based on the boiling of a cryogenic liquid.

There are also detection methods based on reflectometry techniques which aim to identify changes of impedance in a conducting or superconducting line by injecting a test signal into the line and then measuring the back-propagation of this signal to the injection point.

Publication [1] describes a method of time-domain reflectometry applied to superconducting coils at ambient temperature. The proposed method may be used to locate a short circuit between a coil and the cryostat and short circuits between turns of the coil. However, the parameters of the test signal pulses have to be adjusted according to each circuit. This requires the analysis of the frequency response of the coil and the spectrum of the signal. The method requires the addition of a delay cable before the coil to be tested, in order to avoid any overlapping.

Publication [2] describes another method of time-domain reflectometry which requires a simulation followed by a comparison between a voltage measurement method and a time-domain reflectometry method. The method may be applied to a superconducting coil rated at about 70 K. In fact, it was found that the reflectometry signal is not stable enough to allow the detection of a random transition. This is because, in time-domain reflectometry, the detection threshold must be set higher than for voltage measurements, in order to avoid false detections. A delay of 10 seconds was found between the two detections. It was concluded that time-domain reflectometry could be used to verify the impedance of the coil (and therefore its correct operation) before supplying it with power.

Other methods described in [3] and [4] are based on a method of time-frequency domain reflectometry (TFDR), which may or may not be coupled to a Wigner-Ville transform.

In [3], the aim was to diagnose the presence of an insulation fault or faults in an HTS cable, using time-frequency domain reflectometry. Time-domain reflectometry measurements were also made for comparison. The measurements were made at ambient temperature and at the temperature of liquid nitrogen. It was found that, when using time-domain reflectometry, the fault was not sufficiently visible among the noise to be detected. However, the time-frequency method enabled it to be detected and located.

In [4], the aim was to monitor three-phase HTS cables with a time-frequency reflectometry test, because ordinary systems only allowed one phase to be monitored. A random transition was created in one phase by local heating, and the aim was to find the faulty phase as well as the distance of the fault. The random transitions were detected by monitoring the changes of trend of the indicator based on the Wigner-Ville distribution.

Another method, described in [5], has the aim of monitoring the electrical and thermal characteristics of an HTS cable system of the Seoul network with a time-frequency reflectometry method. The temperature at the time of measurement was about 70 K. The experiments were performed while the system was disconnected from the network for routine inspection. It was found that it was not possible to determine the exact temperature, but that its variation could be monitored.

Another method, described in [6], had the aim of detecting a change in local temperature in an HTS cable using a time-frequency method. A simulation was performed and measurements were made by time-domain and time-frequency reflectometry. The simulation showed that the fault was visible with both methods, but very poorly with the time-domain method and more clearly with the time-frequency method. The measurements confirmed the results obtained by simulation: the temperature change was lost in the noise in the time-domain method.

Publication [7] describes yet another method, based on a reflectometry technique using a special signal with a frequency varying in steps.

Finally, European Patent EP-415709 describes a hydraulic sensor for detecting and locating state transitions in superconductors.

All the prior art methods have one or more of the following drawbacks:
 The measurements made on the material are invasive;
 The measurements and/or the processing are too long for detection in view of the rate of variation of the phenomenon;
 The system cannot be regulated, but must be discharged almost entirely;
 The methods yield no information about the proportion of the system that has transited.

SUMMARY OF THE INVENTION

The object of the invention is to propose a novel method for detecting, monitoring and locating random state transitions in a superconducting material, particularly in a superconducting or conducting line.

The proposed method is based on the monitoring of the variation of certain parameters of a time-domain reflectogram which are modified when the propagation velocity of the signal changes. Thus the invention may be used to detect a change of velocity of the signal, indicating the appearance of a state transition of the material. In particular, one parameter monitored is the time position, in the reflectogram, of the peak corresponding to the end of the conducting line, which may vary when the velocity of the signal changes.

The invention is applicable to the detection of faults in conducting lines in the form of cables or coils, but also to lines of superconducting material.

The invention is applicable, notably, to the monitoring of the state of health of electrical systems comprising coils, such as motors, alternators, windings for various fields of application, ranging from nuclear to medicine, aeronautics and energy.

The invention proposes a method for detecting a random transition in a conducting line, comprising the steps of:
 making at least one reference reflectometry measurement on the conducting line, consisting in at least injecting a test signal into the line, measuring a reflection of the back-propagated test signal, and deducing from this a reference time-domain reflectogram,
 identifying at least one characteristic of the reference time-domain reflectogram from among: the time position of at least one amplitude peak, a number of amplitude peaks in the reflectogram, and the amplitude of at least one amplitude peak,
 making at least a second reflectometry measurement on the conducting line to obtain a second time-domain reflectogram,
 identifying the same at least one characteristic in the second time-domain reflectogram, and
 for each amplitude peak identified, determining a difference between the at least one characteristic measured on the reference time-domain reflectogram and the same characteristic measured on the second time-domain reflectogram,
 evaluating, from a plurality of successive measurements, whether said difference increases in absolute value, and, if this is the case, triggering a warning corresponding to the appearance of a random transition.

According to a particular aspect of the invention, the step of evaluating whether the difference increases in absolute value consists in comparing the absolute value of the difference with a predetermined threshold and triggering the warning if the threshold is exceeded.

According to a particular aspect of the invention, the at least one amplitude peak is the last amplitude peak of the time-domain reflectogram, corresponding to a reflection of the test signal from the end of the conducting line.

According to a particular aspect of the invention, a plurality of reflectometry measurements are made and averaged, for determining the reference time-domain reflectogram and the second time-domain reflectogram, respectively.

According to a particular aspect of the invention, the conducting line is a conducting coil.

According to a particular aspect of the invention, the reflectometry measurements are made by:
  Superimposing said conducting coil on a second reference coil whose length is shorter than the length of the conducting coil, the reference coil having a conductor diameter greater than the conductor diameter of the conducting coil, the outside diameter of the reference coil being substantially identical to the outside diameter of the conducting coil,
  connecting a reflectometry device capable of making a reflectometry measurement by means of a coaxial cable having two conductors connected to the conducting coil and to the second reference coil respectively.

According to a particular aspect of the invention, the second reference coil is made of copper.

According to a particular aspect of the invention, the at least one characteristic of a time-domain reflectogram corresponds to a plurality of amplitude peaks of the time-domain reflectogram, and a difference is calculated between the time position of each amplitude peak of the reference time-domain reflectogram and of the second reflectogram, respectively.

In a variant embodiment, the method according to the invention comprises a step of locating the random transition in the conducting line by means of a display on a visual interface of the variation over time of the differences calculated on the basis of the time position of each amplitude peak.

According to a particular aspect of the invention, the conducting line is made of superconducting material, and the random transition is a transition from a superconducting state to a resistive state.

In a variant embodiment, the method according to the invention further comprises a step of cutting or reducing the current in the conducting line when the warning is triggered.

The invention also proposes a system for detecting a random transition in a conducting line, comprising a reflectometry device capable of making a reflectometry measurement in the conducting line and a processing unit configured to execute the steps of the method for detecting a random transition according to the invention.

BRIEF DESCRIPTION OF THE DRAWINGS

Other characteristics and advantages of the present invention will become more apparent in the light of the following description, relating to the attached drawings.

DETAILED DESCRIPTION

Figure 2:
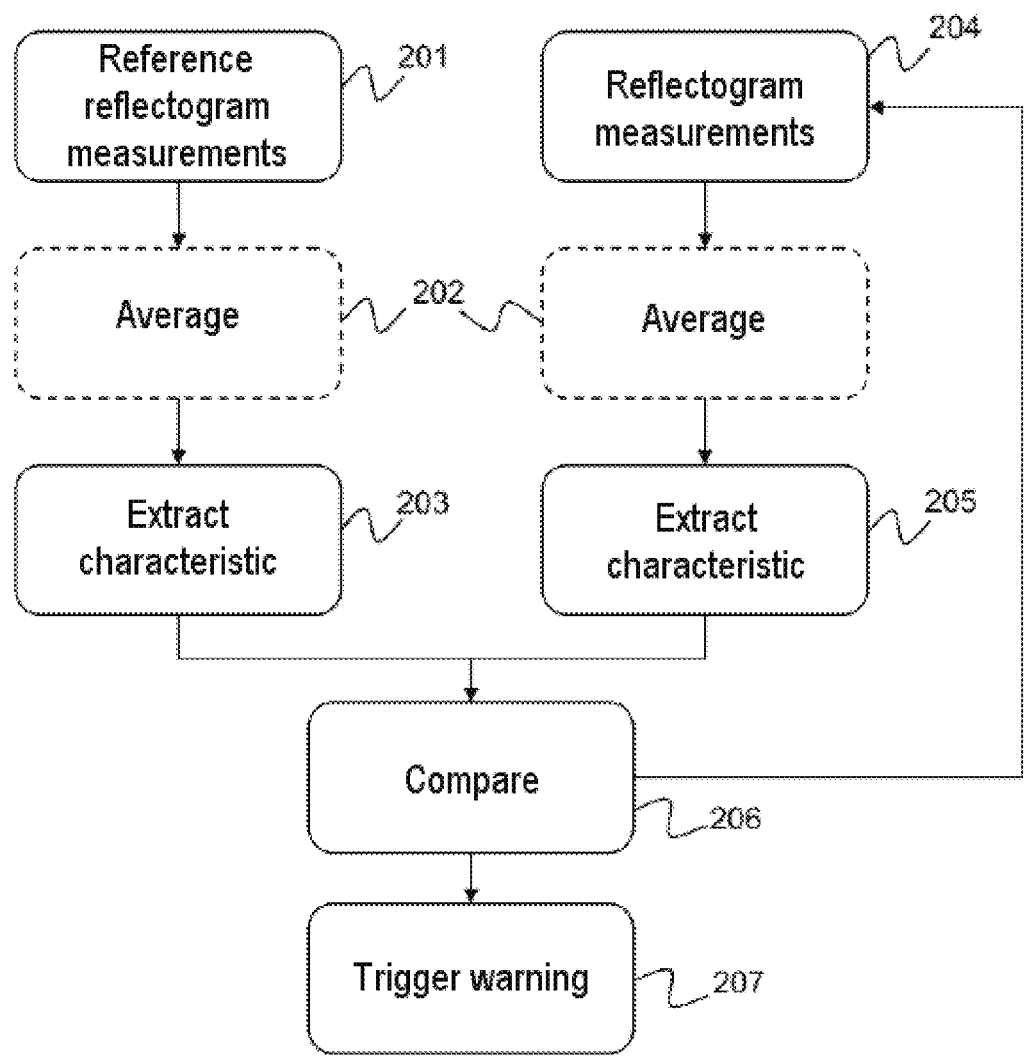
FIG. 2 shows a flow diagram describing the steps of the execution of a method for detecting a random transition in a conducting line according to a first embodiment of the invention.

FIG. 2 shows schematically, in a flow diagram, the steps of the execution of a method for detecting a random transition in a conducting line according to a first embodiment of the invention.

According to this first embodiment, the invention is applied to the detection of a transition from a superconducting state to a resistive state for a superconducting material, for example a superconducting coil.

When such a phenomenon occurs, the material changes to a resistive state; in other words, its resistance increases (from a value of zero in the superconducting state), and therefore the current propagated in the material increases.

The increase in resistance also causes a variation in the velocity of propagation of a reflectometry signal propagating in the material. The invention makes use of this phenomenon to detect the appearance of such random transitions.

For this purpose, the method starts at step 201 with one or more reflectometry measurements made on a superconducting coil, considered to be in a reference state. For this purpose, use is made of a known reflectometry device, the principle of which is indicated in FIGS. 1a and 1b.

Figure 1A:
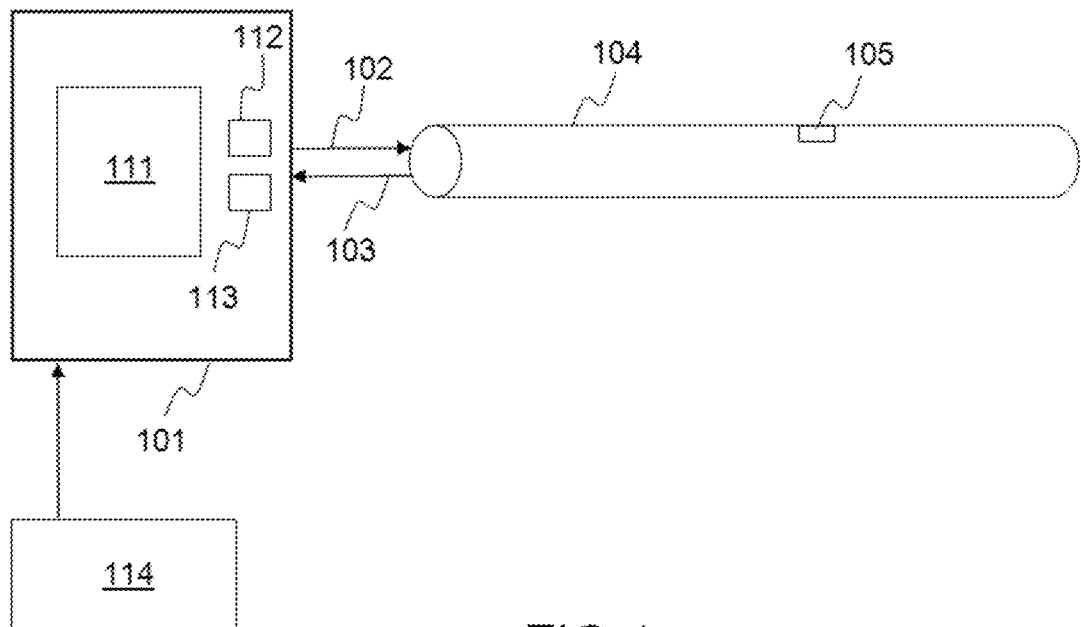
FIG. 1a shows a diagram of a first example of a time-domain reflectometry system.
Figure 1B:
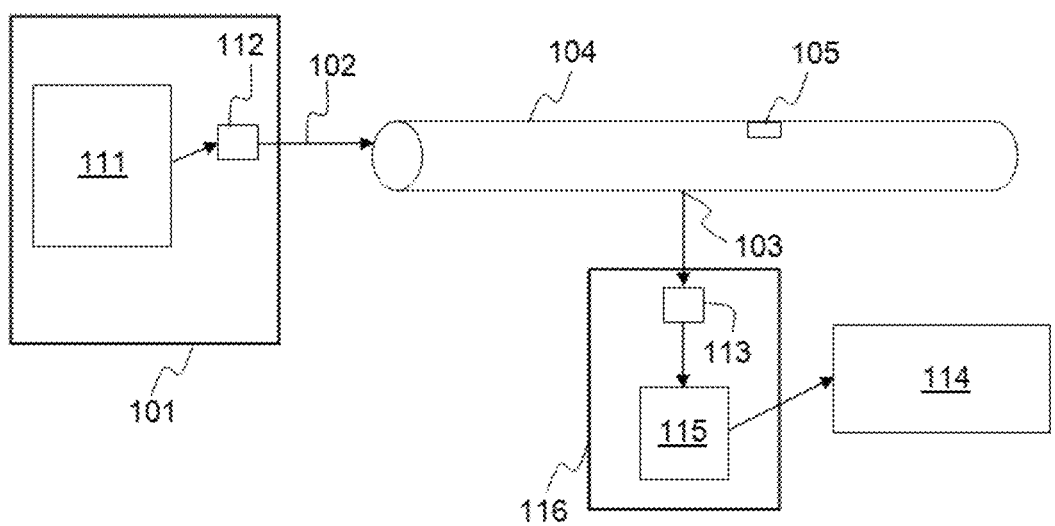
FIG. 1b shows a diagram of a second example of a time-domain reflectometry system.

FIG. 1a shows a conducting line to be tested, for example a cable 104, which has a fault 105 at any distance from an end of the cable.

A reflectometry system 101 comprises an electronic component 111 of the integrated circuit type, such as a programmable logic circuit, for example an FPGA or microcontroller, adapted to perform two functions. On the one hand, the component 111 can be used to generate a reflectometry signal s(t) to be injected into the cable 104 being tested. This digitally generated signal is then converted by a digital-analog converter 112, and then injected 102 into an end of the cable. The signal s(t) is propagated in the cable and is reflected from the singularity caused by the fault 105. The reflected signal is back-propagated to the injection point 106 and then captured 103, digitally converted by means of an analog-digital converter 113, and transmitted to the component 111. The electronic component 111 is also capable of determining a reflectogram or a plurality of reflectograms on the basis of the received signal s(t). The reflectometry system 101 may be implemented, more generally, by using a network analyser, a time-domain reflectometer or an oscilloscope capable of generating signals.

The reflectogram or reflectograms may be transmitted to a processing unit 114 such as a computer, personal digital assistant or other, in order to display the results of the measurements on a human-machine interface.

The system 101 depicted in FIG. 1a is a non-limiting example of embodiment. In particular, the two functions performed by the component 111 can be separated into two distinct components or devices, as shown in the example of FIG. 1b. The signal injection point and the signal measurement point may also be positioned at any point on the cable, instead of at its end.

FIG. 1b shows a first device 101 dedicated to the generation of the reflectometry signal and its injection into the cable, and a second device 116 dedicated to the measurement of the signal at any point on the cable, and then to the calculation of the reflectogram using a component 115.

The component 115 may be an electronic component of the integrated circuit type, such as a programmable logic circuit, for example an FPGA or a microcontroller, for example a digital signal processor, which receives the signal measurements and is configured to execute the method according to the invention. The component 115 comprises at least one memory for saving the last signal samples generated and injected into the cable and the last measured signal samples.

As is known in the field of diagnostic methods using time-domain reflectometry, the position $d_{DF}$ of a fault 105 in the cable 104, in other words its distance from the signal injection point, may be obtained directly from the measurement, on the calculated time-domain reflectogram R(t), of the duration $t_{DF}$ between the first amplitude peak found on the reflectogram and the amplitude peak corresponding to the signature of the fault.

This principle may therefore be used to make one or more time-domain reflectogram measurements on a superconducting coil.

For this purpose, the signal must be injected between two conductors, for example by means of a coaxial cable, using the central core of the cable as a first conductor and the shield or screen of the cable as a second conductor.

Figure 3:
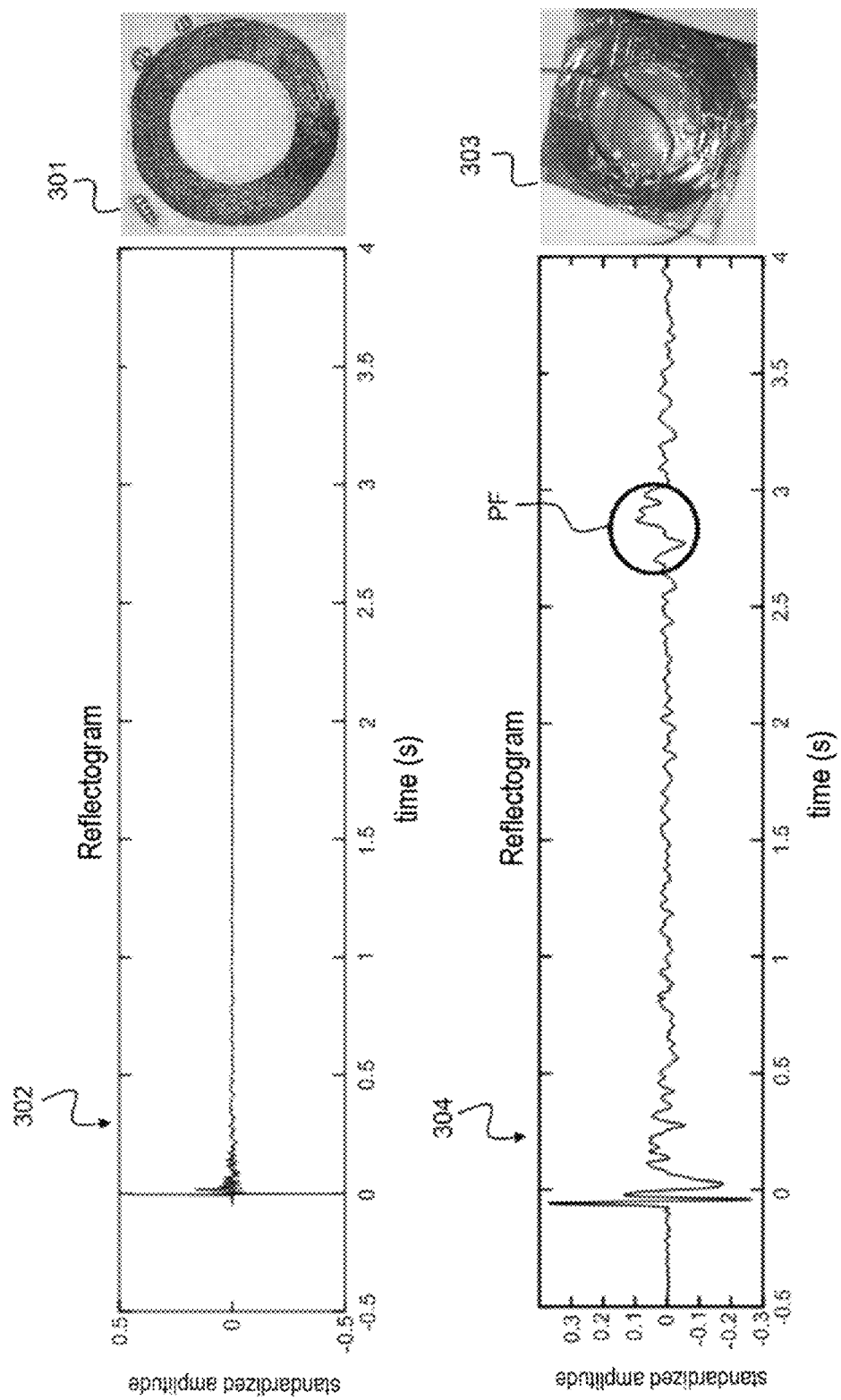
FIG. 3 shows the use of coupling between two coils for making a reflectometry measurement on a superconducting coil.

A problem specific to coils or other cable windings is that the mismatch at the input of the system may be rather large and may create a very high first amplitude peak in the reflectogram. This phenomenon is shown in FIG. 3 which shows, in two examples, a reflectogram measurement made on a superconducting coil (not shown in FIG. 3). The reflectometry measurement is made by connecting the measuring equipment (reflectometer) to the superconducting coil on the one hand and to a reference coil on the other hand, via a coaxial cable. The core of the coaxial cable is connected to the superconducting coil, while the screen of the coaxial cable is connected to the reference coil 301, 303, for example. Alternatively, it is possible to connect the core of the coaxial cable to the reference coil and the screen of the coaxial cable to the superconducting coil.

The first time-domain reflectogram 302 is obtained using a reference coil 301 of the same length as the superconducting coil, with turns of the same dimensions as those of the superconducting coil. In other words, the reference coil 301 has the same dimensions as the reference coil but is, for example, simply conducting, being a copper coil for example.

The reflectogram 302 obtained by this measurement shows a mismatch peak in the reflectogram 302 with such a large amplitude that it masks any other subsequent peaks corresponding to faults, particularly for a reduced dynamic analog-digital converter. This is due to the fact that all the energy of the injected signal is reflected from this input mismatch of the coil and the signal then does not propagate in the rest of the coil. Consequently, it is impossible to observe reflections of the signal beyond the input point of the coil.

One solution for correcting this problem is that of using a reference coil in the form of a copper coil 303 having a smaller length than that of the superconducting coil, but having a substantially identical outside diameter, and being positioned, for example, under the superconducting coil. For example, the core of the coaxial cable is connected to the superconducting coil, while the screen of the coaxial cable is connected to the reference coil 303. For example, the superconducting coil has a length of 30 m, while the reference coil 303 has a length of 3 m, that is to say 10 times shorter. The diameter of the conductor used to form the reference coil 303 is therefore greater than the diameter of the conductor used to form the superconducting coil. The two coils are superimposed on each other.

By coupling the two coils it is possible to attenuate the mismatch peak and to identify the peak corresponding to the end of the coil PF in the reflectogram 304, whereas this was not visible in the reflectogram 302.

The reflectometry measurement 304 made in this way is the image of the shorter conductor 303, so that, theoretically, some precision is lost from the measurement, but this makes it possible to display greater lengths of the system under investigation.

By using coupling between two coils having different conductor lengths and diameters, it is possible to resolve this first problem related to the amplitude of the mismatch peak and to produce a usable time-domain reflectogram 304.

Without departure from the scope of the invention, other devices may be used to replace the reference coil 303 for the purpose of cancelling or reducing the amplitude of the mismatch peak.

One aim of the invention is to analyse the time-domain reflectogram measurements in order to detect a change of velocity of the signal that is indicative of the appearance of a random transition.

For this purpose, one or more reference measurements are made in step 201 on an initially healthy conductor, that is to say one in its superconducting state.

Optionally, an averaging step 202 is executed on a set of measurements to reduce the signal to noise ratio.

A particular characteristic of the reflectogram, chosen from among the time position of the peak at the end of the line, the amplitude of this peak, and the number of peaks found on the reflectogram, is extracted in step 203.

For example, the last amplitude peak of the reflectogram corresponds to the reflection of the signal at the end of the line. Thus this peak is always present on the reflectogram, even in the total absence of any fault.

As is known, the temporal abscissa of the last peak of the reflectogram is linked to the distance between the signal injection point and the end of the line by the relation $2 \times d = t_{PF} \cdot V$, where V is the velocity of the signal, which depends, notably, on the properties of the superconducting line. The distance d is equal to the total length of the coil in the most general case, where the signal is injected at one end of the line.

When a random transition appears, the superconducting coil changes locally from a superconducting state to a resistive state, which may cause changes in the temperature, current or magnetic field. These changes then cause a modification of the velocity of the test signal propagated in the line.

Thus, if the velocity V changes, while the distance d is constant, the temporal abscissa $t_{PF}$ of the end of line peak on the reflectogram will also change.

The invention makes use of this phenomenon in order to monitor and detect the appearance of a random state transition of the material.

In step 204, one or more new reflectogram measurements are made, in the same conditions as those made in step 201 for reference. The measurements are averaged (step 202) if necessary, and then the same characteristic as in step 203, for example the time position of the end of line peak, is extracted from the resulting reflectogram in step 205.

If the velocity of the signal has not changed, the positions measured in steps 203 and 206 are substantially identical; otherwise, a difference should be observed.

Thus, in step 206, the absolute value of the difference between the two positions is compared with a predetermined threshold. If this threshold is exceeded, a warning is triggered at step 207, which may, for example, cause the current to be cut off in the coil to avoid damaging the coil. In all cases, a return is made to step 204 to make new measurements periodically or at a predefined rate enabling variations in the line to be monitored.

If a warning is triggered, it may be transmitted to the equipment for safeguarding the system comprising the superconducting coil, for an emergency stop or an adjusting of the system by reducing the current supplied.

If the current supplied is reduced, the method may continue by making new measurements 204 in order to monitor the variation of the transition and to detect a return of the coil to the superconducting state when the difference between the two positions returns to a level below the threshold at step 206.

Figure 4:
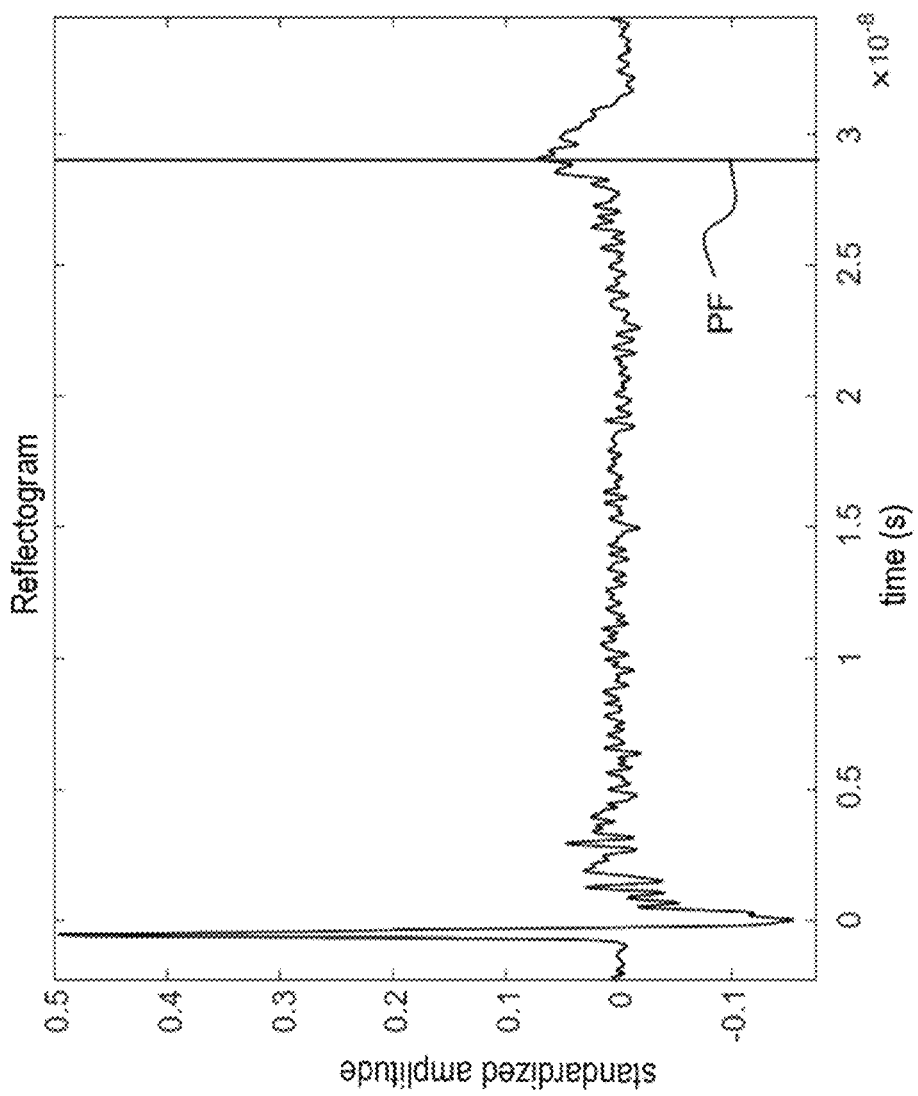
FIG. 4 shows an example of a reflectogram obtained by means of the device described in FIG. 3.

FIG. 4 shows, in an example of a reflectogram, the time position of the measured end of line peak.

In a variant embodiment, step 206 may consist in detecting a progressive increase in the difference between the measured positions in absolute value, which is a sign of the appearance of a transition. This evaluation is then performed on a plurality of successive measurements.

Figure 5:
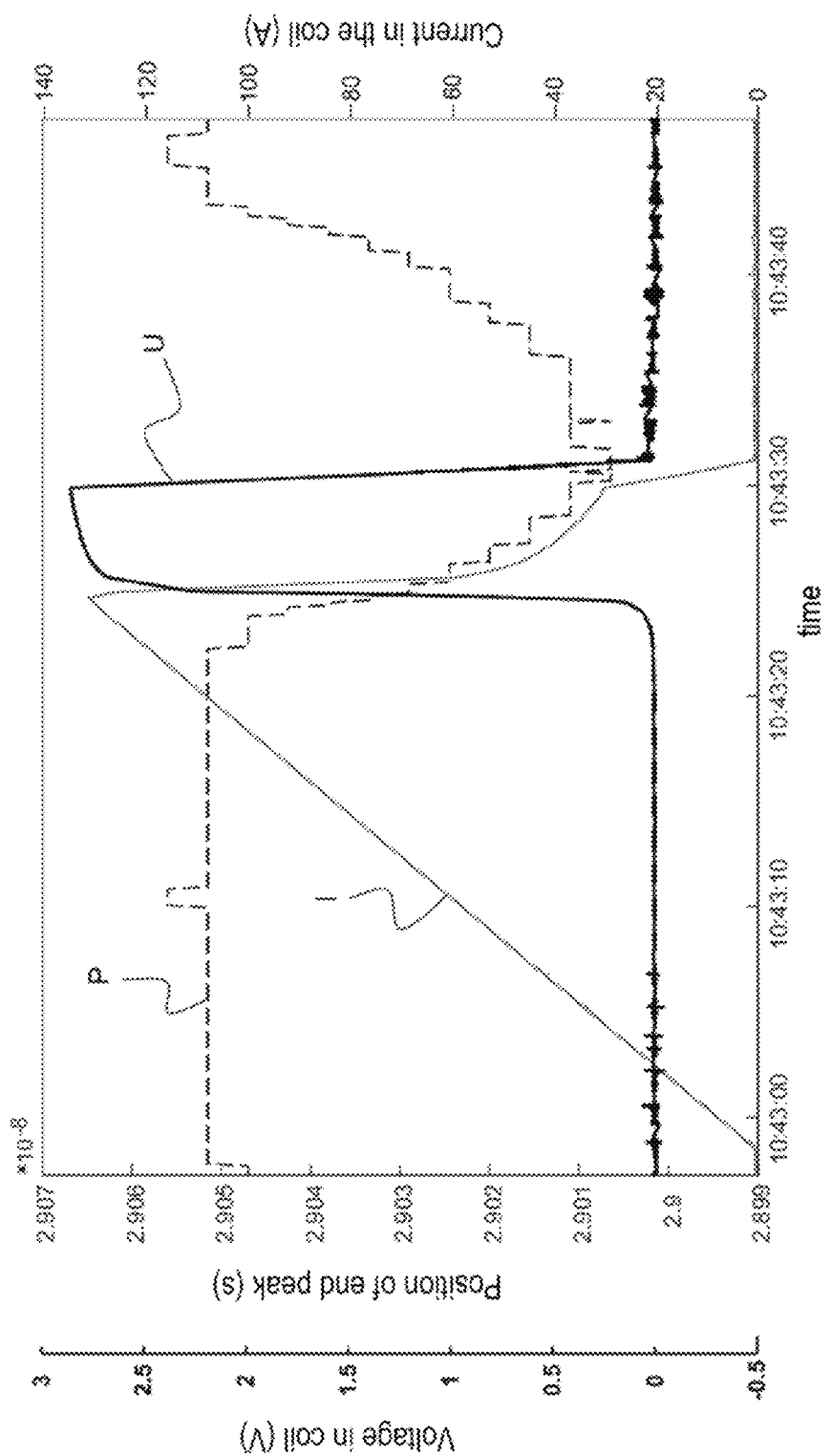
FIG. 5 shows in a timing diagram a first example of the variation of a plurality of parameters in the presence of a random transition in a superconducting coil.

FIG. 5 shows the effect of a state transition in the superconducting coil on the difference between the time positions measured at step 206.

FIG. 5 shows, on the same timing diagram, the variation of the voltage U at the terminals of the coil, of the current I flowing through the coil, and of the variation P of the time position of the end of line peak over time. In the example of FIG. 5, a transition is caused by increasing the current I in the coil progressively until the voltage U at the terminals of the coil exceeds a voltage threshold. When this threshold is reached, the current is cut off in the coil to prevent it from being damaged. The coil is connected to a suitable resistance to allow its discharge.

It may be seen in FIG. 5 that the time position P of the end of line peak decreases when the voltage U exceeds a certain threshold, but rises again when the voltage U again decreases. In this example, the value of the time position of the end of line peak when the coil is in the superconducting state corresponds to the maximum value of the position P of the end of line peak in FIG. 5.

Thus, by detecting a variation of the time position P of the end of line peak with respect to its reference value, it is possible to detect the appearance of a random state transition of the material.

According to a variant embodiment, the position of the end of line peak is replaced by the number of peaks detected in the reflectogram as the characteristic extracted from the reflectogram in steps 203 and 205.

Figure 6:
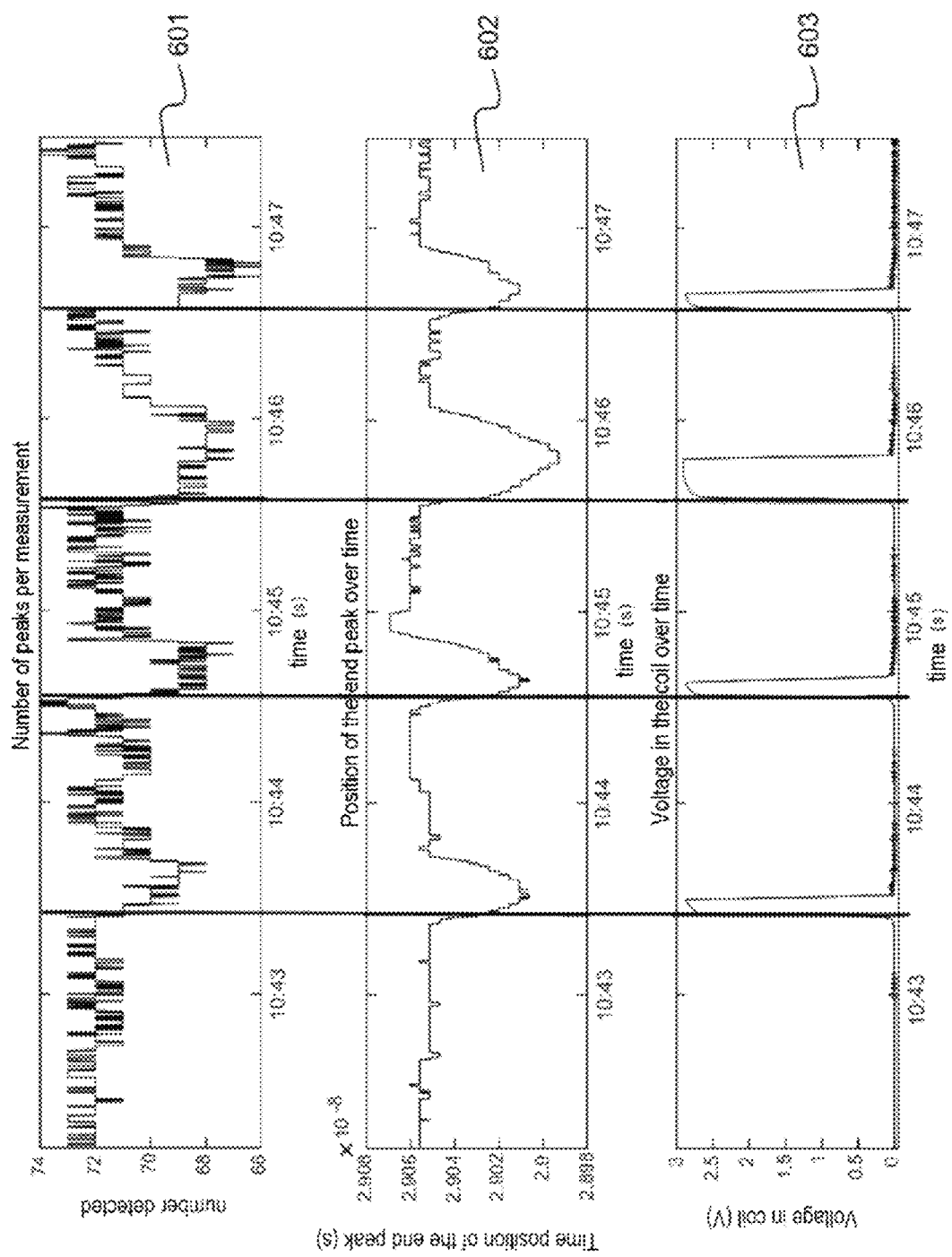
FIG. 6 shows, in a number of diagrams, a second example of variations of a plurality of parameters in the presence of a random transition in a superconducting coil.

In this case, a detection threshold is defined, so that the peaks corresponding to reflections of the signal from impedance discontinuities can be separated from those corresponding to measurement noise. The number of peaks in the reflectogram exceeding the threshold is then counted. If the velocity of the signal increases when a random transition appears, the number of peaks in the reflectogram decreases, as may be seen in FIG. 6.

Diagram 601 shows the number of peaks detected in the reflectogram as a function of time. Diagram 602 shows the position of the end peak in the reflectogram as a function of time. Diagram 603 shows the variation of the voltage in the coil over time.

It may be noted that the number of peaks varies, as does the position of the end peak, when the voltage increases in the coil as a sign of the appearance of a random state transition.

In yet another variant embodiment, the characteristic extracted from the reflectogram is the amplitude of the end of line peak. This is because this amplitude also varies as a function of the velocity of the signal in the cable.

In yet another variant embodiment, steps 203 and 205 of the method according to the invention consist in extracting a plurality of characteristics from the reflectogram, from among the position of the end of line peak, the number of peaks and the amplitude of the end of line peak, and determining a difference from a reference for each of these characteristics. In this case, in step 206, a combination of these differences is calculated and compared with a predefined threshold, and a warning is triggered in step 207 if at least one threshold is exceeded. The warning thresholds are determined a priori, by preliminary simulation or tests, for example.

Figure 7:
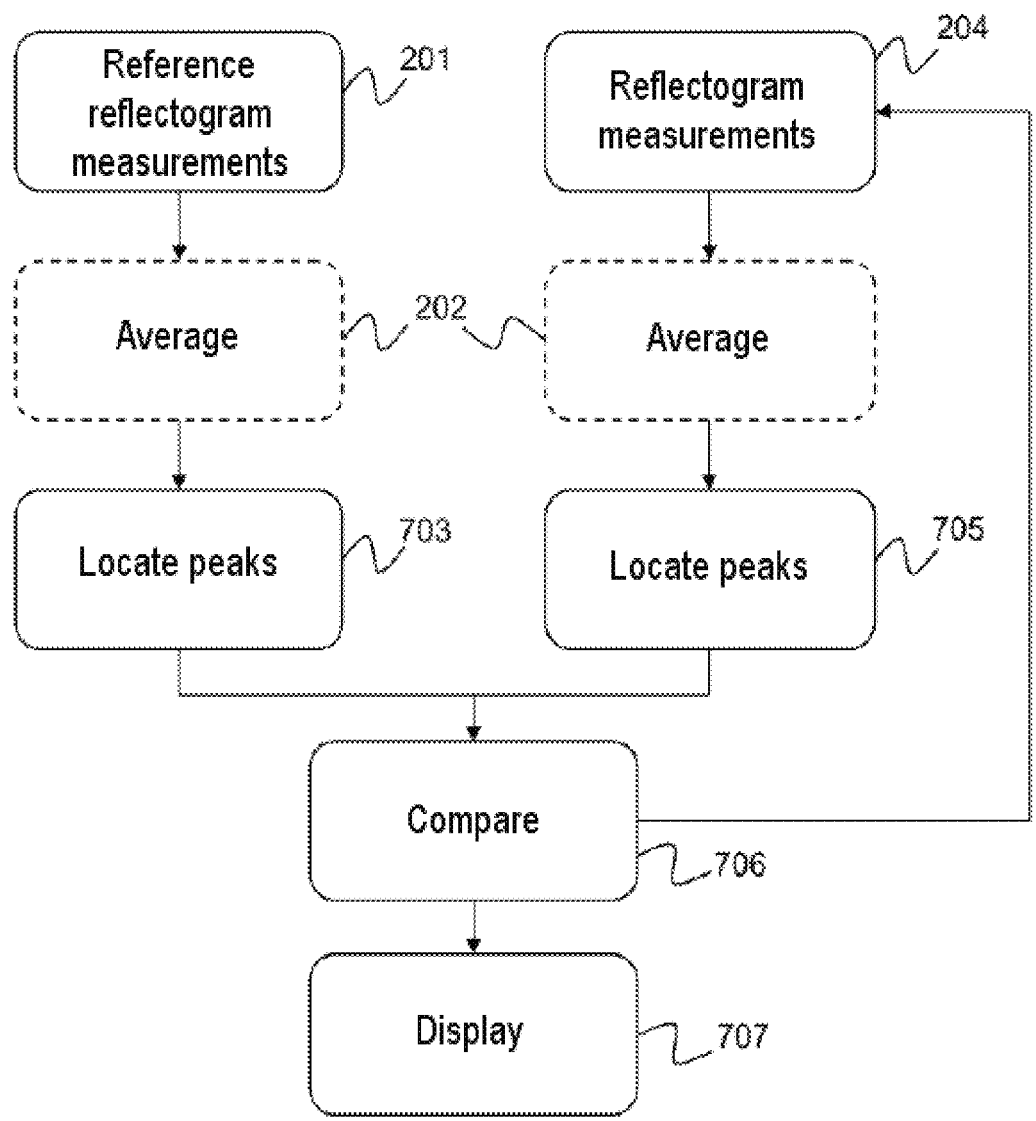
FIG. 7 shows a flow diagram of a second embodiment of the invention.

FIG. 7 shows schematically, in a flow diagram, the steps of the execution of a method for detecting, monitoring and locating a random transition in a conducting line according to a second embodiment of the invention.

In this second embodiment, the initial steps of reflectogram measurement 201, 204 and averaging 202 are identical to those of the first embodiment.

This time, by contrast with the first embodiment, the characteristics extracted from the reflectogram in steps 703, 705 correspond to the set of the time positions of the peaks detected in the reflectogram, that is to say the peaks whose amplitude exceeds a certain predefined threshold.

As mentioned above, a variation of the propagation velocity of the signal causes a time shift of all the peaks in the reflectogram that correspond to discontinuities of impedance located at specific points in the coil.

Thus it is possible to enlarge the comparison between the reference reflectogram and a reflectogram measured at an instant after all the peaks initially detected.

Figure 8:
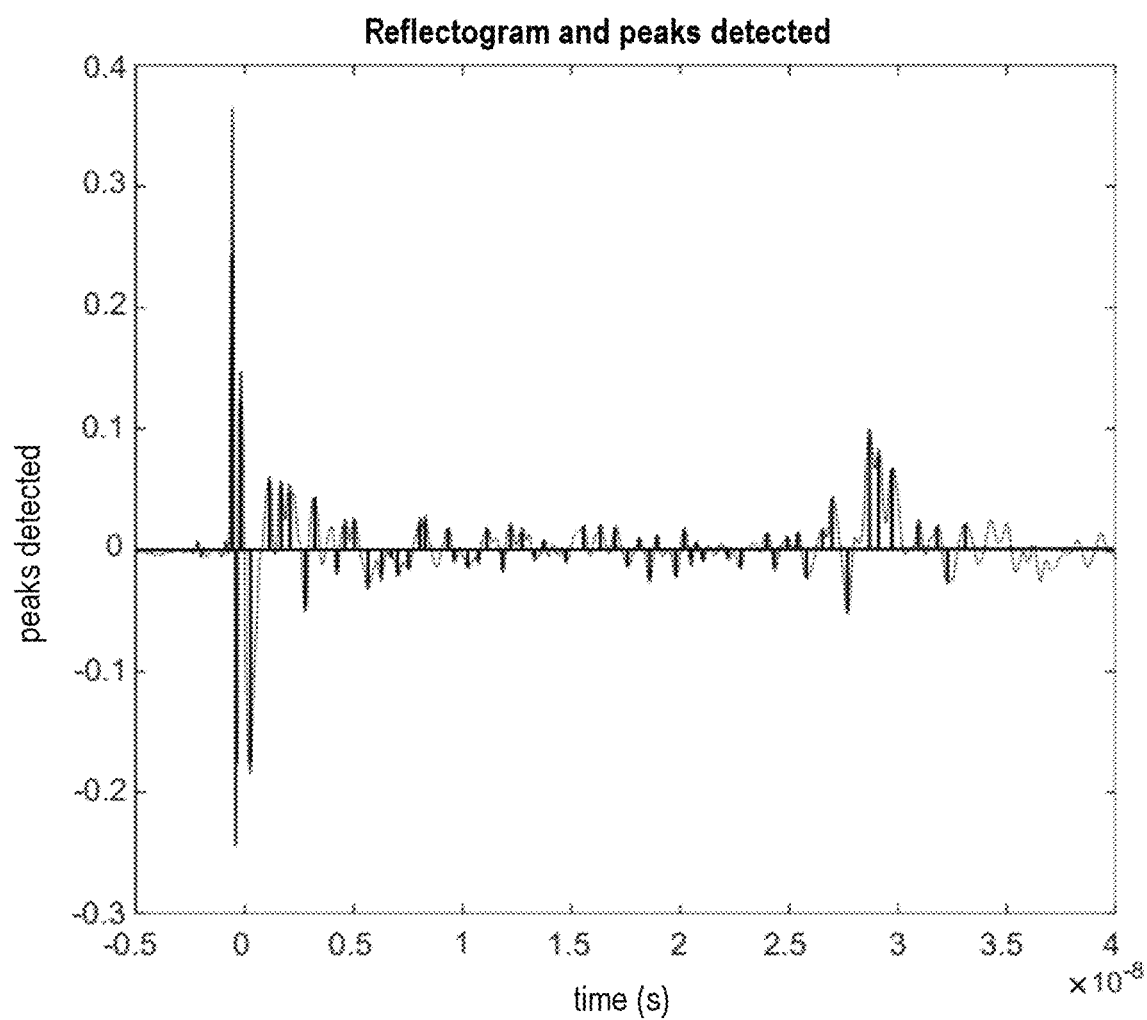
FIG. 8 shows an example of the location of amplitude peaks in a time-domain reflectogram.

The peaks are localized, for example, by means of a transformation of the local extrema of the reflectogram into a Dirac time series, as shown in an example in FIG. 8.

In step 706, the shift of each peak from its position in the reference measurement (obtained in step 703) is calculated.

By monitoring the variation of these differences, it is possible not only to detect the appearance of a random transition but also to locate it according to which peaks of the reflectogram are varying. For example, the result of the comparison step 706 may be that only the position of the peaks located at the end of the conducting line varies, while the position of the peaks located at the start of the conducting line remains stable.

The differences in position calculated in step 706 may be displayed (step 707) on a user interface, in order to display the appearance of a transition and its location in the reflectogram.

There are a number of feasible possibilities for displaying the results in step 707.

Figure 9:
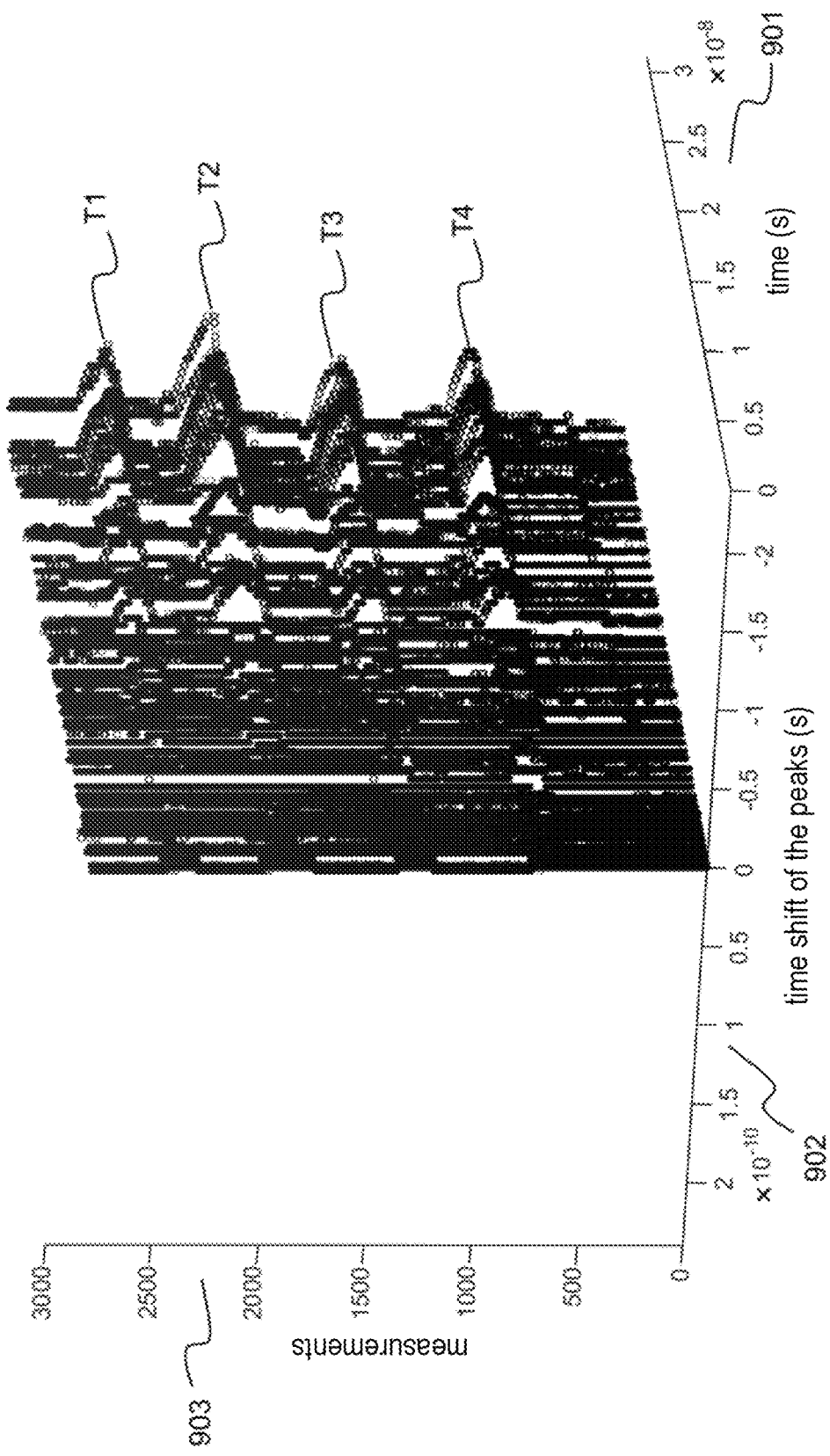
FIG. 9 shows a first example of the display of the results of the second embodiment.

FIG. 9 shows a first possible type of display in the form of a 3D diagram in which the first axis 901 corresponds to the time axis of a reflectogram, the second axis 902 corresponds to the value of the time difference measured in step 706 for each peak, and the third axis 903 corresponds to a reflectogram measurement made at a given instant.

In the example of FIG. 9, four successive random transitions T1, T2, T3, T4 appear over time and are more likely to be located at the end of the reflectogram, corresponding to half of the coil located towards the inside of the coil, that is to say near its opposite end from the signal injection point.

Figure 10:
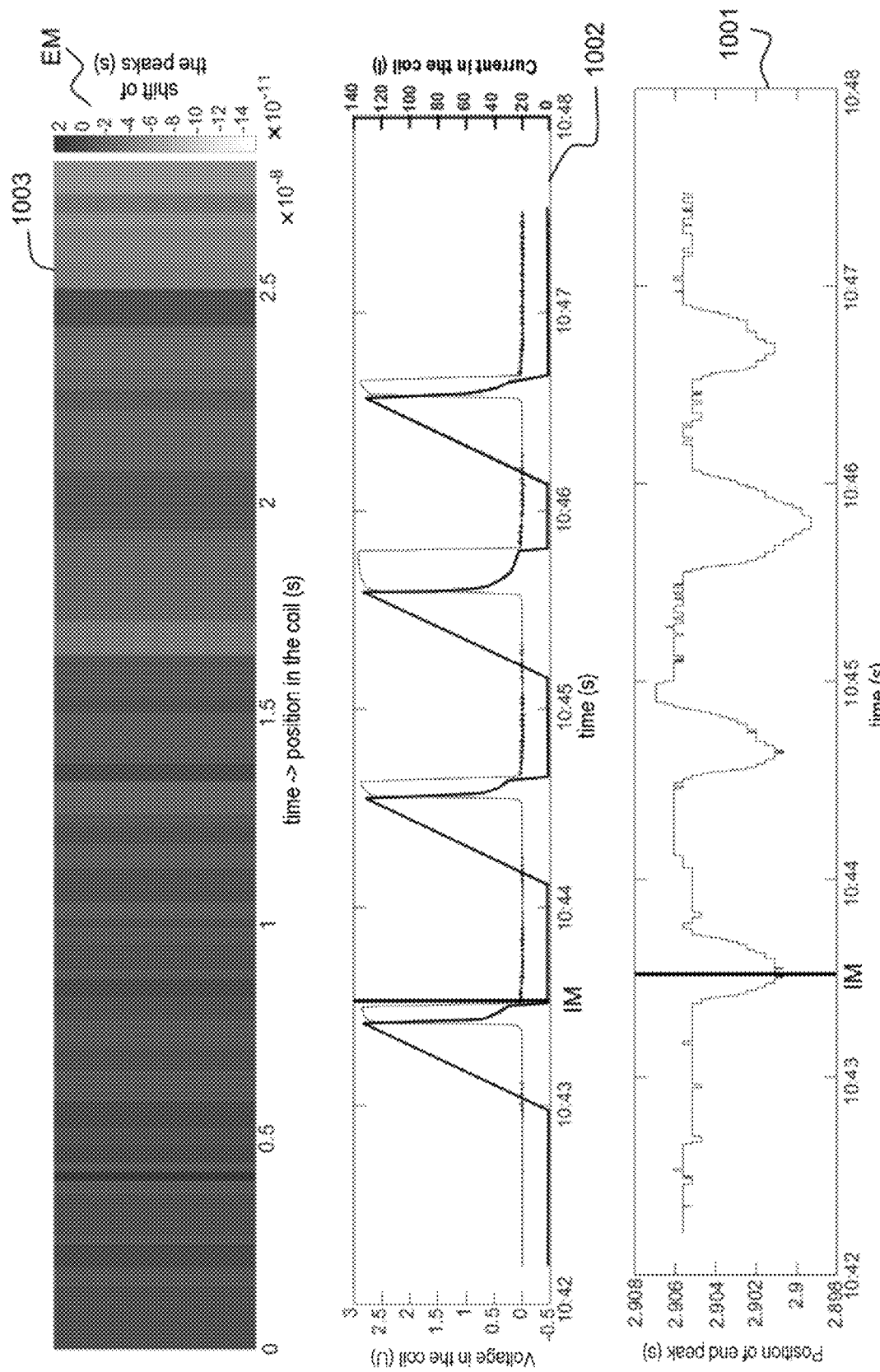
FIG. 10 shows a second example of the display of the results of the second embodiment.

FIG. 10 shows a second possible type of display, in the form of a sequence of timing diagrams 1003. FIG. 10 shows, by way of illustration, the variation of the current and the voltage over time in a superconducting coil on diagram 1002, together with the variation of the position of the end of line peak of the reflectogram on diagram 1001.

Diagram 1003 shows the value of the difference measured at each peak of the reflectogram (represented by the scale EM) at a given instant (that is to say, for a given measurement). The instant of the measurement corresponding to diagram 1003 is identified on diagrams 1001 and 1002 by the reference IM.

The time axes of diagrams 1001 and 1002 correspond to an axis of measurements (each point corresponds to a reflectogram measurement made at a given instant).

The time axis of diagram 1003 corresponds to the time axis of a reflectogram, which therefore represents the outward and return propagation time of the signal along the coil. The high-level values of the differences in position are represented by a lighter grey level than small values of differences, which are represented by a darker grey level.

Thus, in diagram 1003, each time position corresponds to a peak identified in the reflectogram in step 705. In the example of FIG. 10, it may be seen that the positions of the peaks in the second half of the reflectogram vary more than those in the first half, indicating the appearance of a random transition in the second half of the coil, located inside the coil.

Diagram 1003 is displayed on a user interface for each new measurement, making it possible to display the variation over time of the differences in position of the peaks along the reflectogram, and thus to identify the spatial variation of a random transition along the coil.

The invention may be implemented using a device of the type described in FIGS. 1a and 1b, which comprises a reflectometry measuring instrument for injecting a test signal into a coil and measuring the reflection of the signal in order to produce a time-domain reflectogram. The coupling means described in FIG. 3 may be used to limit the amplitude of the peak input impedance mismatch in the coil.

The measuring equipment is coupled to a processing unit for executing the steps of the method for detecting a state transition according to an embodiment of the invention, and to a display interface for displaying the results produced by the method.

[1] "Locating electrical faults in superconducting accelerator magnets using time domain reflectometry. *IEEE TRANSACTIONS ON APPLIED SUPERCONDUCTIVITY*", Grzegorz Beziuk, A. S. (2018).

[2] Bin Chen, Y. H. (2020). Research on quench detection method using radio frequency wave technology. *IEEE TRANSACTIONS ON APPLIED SUPERCONDUCTIVITY.*

[3] Geon Seok Lee, G.-Y. K.-H.-J. (2016). Time-frequency-based insulation diagnostic technique of high-temperature superconducting cable systems. *IEEE TRANSACTIONS ON APPLIED SUPERCONDUCTIVITY.*

[4] Su Sik Bang, Y.-J. S. (2021). Abnormality monitoring for three-phase HTS cable via time-frequency domain reflectometry. *IEEE TRANSACTIONS ON APPLIED SUPERCONDUCTIVITY.*

[5] Geon Seok Lee, G.-Y. K.-H.-J. (2017). Monitoring electrical and thermal characteristics of HTS cable systems via time-frequency domain reflectometry. *IEEE TRANSACTIONS ON APPLIED SUPERCONDUCTIVITY.*

[6] Su Sik Bang, G. S.-Y.-J. (2017). Detection of local temperature change on HTS cables via time-frequency domain reflectometry. *Journal of Physics: Conference Series, 29th International Symposium on Superconductivity.*

[7] Chun-Kwon Lee, G.-Y. K.-J. (2019). Insulation characteristics and fault analysis of HTS cable via stepped frequency waveform reflectometry. *IEEE TRANSACTIONS ON APPLIED SUPERCONDUCTIVITY.*

The invention claimed is:

1. A method for detecting a random transition in a conducting line, comprising the steps of:
    making at least one reference reflectometry measurement on the conducting line, consisting in at least injecting a test signal into the line, measuring a reflection of the back-propagated test signal, and deducing from this a reference time-domain reflectogram,
    identifying at least one characteristic of the reference time-domain reflectogram from among: the temporal position of at least one amplitude peak, a number of amplitude peaks in the reflectogram, and the amplitude of at least one amplitude peak,
    making at least a second reflectometry measurement on the conducting line to obtain a second time-domain reflectogram,
    identifying the same at least one characteristic in the second time-domain reflectogram, and
    for each amplitude peak identified, determining a difference between the at least one characteristic measured on the reference time-domain reflectogram and the same characteristic measured on the second time-domain reflectogram,
    evaluating, from a plurality of successive measurements, whether said difference increases in absolute value, and, if this is the case, triggering a warning corresponding to the appearance of a random transition.

2. The method for detecting a random transition according to claim 1, wherein the step of evaluating whether the difference increases in absolute value consists in comparing the absolute value of the difference with a predetermined threshold and triggering the warning if the threshold is exceeded.

3. The method for detecting a random transition according to claim 1, wherein the at least one amplitude peak is the last amplitude peak of the time-domain reflectogram, corresponding to a reflection of the test signal from the end of the conducting line.

4. The method for detecting a random transition according to claim 1, wherein a plurality of reflectometry measurements are made and averaged for determining the reference time-domain reflectogram and the second time-domain reflectogram, respectively.

5. The method for detecting a random transition according to claim 1, wherein the conducting line is a conducting coil.

6. The method for detecting a random transition according to claim 5, wherein the reflectometry measurements are made by:
   superimposing said conducting coil on a second reference coil whose length is shorter than the length of the conducting coil, the reference coil having a conductor diameter greater than the conductor diameter of the conducting coil, the outside diameter of the reference coil being substantially identical to the outside diameter of the conducting coil,
   connecting a reflectometry device capable of making a reflectometry measurement by means of a coaxial cable having two conductors connected to the conducting coil and to the second reference coil respectively.

7. The method for detecting a random transition according to claim 6, wherein the second reference coil is made of copper.

8. The method for detecting a random transition according to claim 5, wherein the at least one characteristic of a time-domain reflectogram corresponds to a plurality of amplitude peaks of the time-domain reflectogram, and a difference is calculated between the time position of each amplitude peak of the reference time-domain reflectogram and of the second reflectogram, respectively.

9. The method for detecting a random transition according to claim 8, comprising a step of locating the random transition in the conducting line by means of a display on a visual interface of the variation over time of the differences calculated on the basis of the time position of each amplitude peak.

10. The method for detecting a random transition according to claim 1, wherein the conducting line is made of superconducting material, and the random transition is a transition from a superconducting state to a resistive state.

11. The method for detecting a random transition according to claim 10, further comprising a step of cutting or reducing the current in the conducting line when the warning is triggered.

12. A system for detecting a random transition in a conducting line, comprising a reflectometry device capable of making a reflectometry measurement in the conducting line and a processing unit configured to execute the steps of the method for detecting a random transition according to claim 1.

* * * * *